(12) United States Patent
Zhou

(10) Patent No.: US 9,824,918 B2
(45) Date of Patent: Nov. 21, 2017

(54) METHOD FOR ELECTROMIGRATION AND ADHESION USING TWO SELECTIVE DEPOSITION

(71) Applicant: Semiconductor Manufacturing International (Shanghai) Corporation, Shanghai (CN)

(72) Inventor: Ming Zhou, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/145,665

(22) Filed: Dec. 31, 2013

(65) Prior Publication Data
US 2015/0028483 A1    Jan. 29, 2015

(30) Foreign Application Priority Data

Jul. 23, 2013    (CN) .......................... 2013 1 0312323

(51) Int. Cl.
| | | |
|---|---|---|
| *H01L 21/44* | (2006.01) | |
| *H01L 21/768* | (2006.01) | |
| *H01L 23/532* | (2006.01) | |

(52) U.S. Cl.
CPC .. *H01L 21/76841* (2013.01); *H01L 21/76811* (2013.01); *H01L 21/76834* (2013.01); *H01L 21/76849* (2013.01); *H01L 21/76856* (2013.01); *H01L 23/53238* (2013.01); *H01L 23/53295* (2013.01); *H01L 2924/0002* (2013.01)

(58) Field of Classification Search
CPC .......... H01L 21/0206; H01L 21/02063; H01L 21/76841; H01L 23/53238; H01L 23/53295
USPC .......... 438/687, 658; 257/762; 427/539, 535
See application file for complete search history.

(56) References Cited

U.S. PATENT DOCUMENTS

| | | | | |
|---|---|---|---|---|
| 6,376,355 | B1 * | 4/2002 | Yoon ................. | H01L 21/76843 257/E21.586 |
| 2004/0082167 | A1 * | 4/2004 | Seo ................... | H01L 21/76843 438/658 |
| 2007/0155141 | A1 * | 7/2007 | Ban ........................ | H01L 29/45 438/508 |
| 2007/0164442 | A1 * | 7/2007 | McTeer ............. | H01L 21/76834 257/762 |
| 2009/0269507 | A1 * | 10/2009 | Yu ..................... | H01L 21/02074 427/535 |
| 2012/0269987 | A1 * | 10/2012 | Dordi ................. | H01L 21/0206 427/539 |

(Continued)

*Primary Examiner* — Cory Eskridge
(74) *Attorney, Agent, or Firm* — Kilpatrick Townsend & Stockton LLP

(57) ABSTRACT

A method of manufacturing a semiconductor device includes providing a semiconductor substrate, sequentially forming an etch stop layer and an interlayer dielectric layer on the semiconductor substrate, forming a copper metal interconnect structure in the interlayer dielectric layer, forming a copper layer in the copper metal interconnect structure, forming a cobalt layer on the copper layer, and forming an aluminum nitride layer on the cobalt layer. The stack of cobalt layer and copper layer effectively suppresses electromigration caused by diffusion of the copper layer into the interlayer dielectric layer, improves the adhesion between the copper layer and the etch stop layer, and prevents delamination.

19 Claims, 6 Drawing Sheets

(56) References Cited

U.S. PATENT DOCUMENTS

2015/0056802 A1\* 2/2015 Shih .................. H01L 23/53295
438/666

\* cited by examiner

METHOD FOR ELECTROMIGRATION AND ADHESION USING TWO SELECTIVE DEPOSITION

CROSS-REFERENCES TO RELATED APPLICATIONS

This application claims priority to Chinese Application No. 201310312323.X, filed on Jul. 23, 2013 with the State Intellectual Property Office of People's Republic of China, the content of which is incorporated herein by reference in its entirety.

FIELD OF THE INVENTION

The present invention relates generally to semiconductor technology. More particularly, embodiments of the present invention provide a semiconductor device having improved electromigration characteristics and a method for manufacturing the semiconductor device.

BACKGROUND OF THE INVENTION

Increasing circuit density has not only improved the complexity and performance of integrated circuit devices but also has provided lower cost parts to consumers. With decreasing feature sizes and increasing current density in semiconductor devices, the resilience of interconnect structures in the devices to damages caused by electromigration also decreases. Therefore, electromigration characteristics have become one of the key indicators for characterizing the reliability of semiconductor devices.

In a semiconductor logic circuit device, the copper interconnect structure can have from a few to several tens of conductive layers, which are interposed between interlayer dielectric layers made of a material having a low dielectric constant. The number of the copper layers corresponds to the number of interlayer dielectric layers disposed between the copper layer metal interconnect structure. Due to the low mechanical strength of low dielectric constant materials and the poor adhesion between the copper and the etch stop layers disposed in the copper interconnect structure, the etch stop layer and the copper layer in the copper interconnect structure is prone to delamination that results in a diffusion of copper into the interlayer dielectric layer, thereby causing an increase in electromigration and a substantial drop in electrical properties of the semiconductor device.

Thus, there is a need for a method and device to solve the above problems.

BRIEF SUMMARY OF THE INVENTION

The present invention provides a method of manufacturing a semiconductor device to overcome the above-described problems in the prior art. According to an embodiment of the present invention, a method for making an integrated circuit device or system with one or more interconnects is provided. The method includes providing a semiconductor substrate, forming an etch stop layer on the semiconductor substrate and an interlayer dielectric layer on the etch stop layer, and forming a copper interconnect structure in the interlayer dielectric layer. The method further includes forming a copper layer in the copper interconnect structure, forming a cobalt layer on the copper layer, and forming an aluminum nitride (AlN) layer on the cobalt layer.

In one embodiment, the cobalt layer is formed using a selective chemical vapor deposition process. The cobalt layer has a thickness in the range between about 1 and about 20 angstroms, In one embodiment, the cobalt layer is deposited at a temperature of about 400° C. or less, under a pressure between about 0.01 Torr to about 20 Torr, and using a carrier gas of helium or argon.

In one embodiment, the cobalt layer is selectively deposited on a metallic surface using an organic cobalt compound precursor.

In one embodiment, the organic cobalt compound is a cyclopentadienyl dicarbonyl cobalt ($C_7H_5CoO_2$) compound.

In one embodiment, the process step of forming the AlN layer includes forming a metal layer of aluminum on the cobalt layer, and submitting the aluminum layer to a nitrogen-containing plasma gas treatment to convert the aluminum layer to an aluminum nitride layer.

In one embodiment, the aluminum layer is formed using a selective chemical vapor deposition process. In one embodiment, the aluminum layer has a thickness in the range between about 1 Å and about 20 Å.

In one embodiment, the aluminum layer is deposited at a temperature of 400° C. or less, under a pressure of about 0.01 Torr to about 20 Torr, and using a carrier gas of helium or argon.

In one embodiment, the aluminum layer is selectively deposited on a metal surface using an organic aluminum compound precursor.

In one embodiment, the organic aluminum compound is dimethyl ethyl amine alane (DMEAA).

In one embodiment, the aluminum layer is deposited using a plasma process at a temperature of between about 10° C. and about 400° C., under a pressure of about 0.001 Torr to about 7.0 Torr, with a plasma power of 100 to 2000 W, and a flow rate of a nitrogen-containing gas of 100-2000 sccm.

In one embodiment, the nitrogen-containing gas is a nitrogen or ammonia gas.

In one embodiment, after forming the copper interconnect structure, the method further includes removing the etch stop layer through the copper interconnect structure and carrying out a process after the removal of the etch step layer.

In one embodiment, the method further includes, before forming the copper layer, sequentially forming a copper diffusion barrier layer and a copper seed layer on the bottom and at the sidewalk of the copper interconnect structure.

In one embodiment, the material of the copper diffusion barrier layer is a metal, a metal nitride, or combinations thereof.

In one embodiment, the material of the etch stop layer is SiCN, SiC or SiN.

In one embodiment, the inter-layer dielectric layer is a material includes a material having a low dielectric constant.

Embodiments of the present invention also provide a semiconductor device that includes a semiconductor substrate, a stack comprising an etch stop layer and a dielectric layer sequentially disposed on the semiconductor, a copper interconnect structure within the dielectric layer, a copper layer disposed in the copper interconnect structure, a cobalt layer on the copper layer, and an aluminum nitride (AlN) on the cobalt layer.

According to the present invention, a stack of cobalt layer and an AlN layer deposited in sequence on the copper layer in the copper interconnect structure can effectively prevent electromigration caused by interlayer diffusion of the copper layer into the upper dielectric layer, and significantly improve the adhesion between that copper layer and the upper etch stop layer subsequently formed thereon, and effectively prevent the interlayer delamination.

The following description, together with the accompanying drawings, will provide a better understanding of the nature and advantages of the claimed invention.

DETAILED DESCRIPTION OF THE INVENTION

Specific embodiments are described below. Those skilled in the art with access to the present disclosure will recognize that modifications and alternatives can also be implemented within the scope of the claimed invention.

The following description is of the best-contemplated mode of carrying out the invention. This description is made for the purpose of illustrating the general principles of the invention and should not be taken in a limiting sense. The scope of the invention is best determined by reference to the appended claims.

It is understood that, in this specification, the terms "comprises", "comprising", "includes", "including" or similar terms may include a list of stated features, integers, steps, operations, elements, and/or components, but may also include other features, integers, steps, operations, elements, components, or any of their combinations not listed.

With reference to FIGS. 1A-1J and 2, process steps of a method for making a semiconductor device having improved electrical characteristics according to an exemplary embodiment of the present invention will be described in detail.

FIGS. 1A-1E are simplified sectional views showing conventional process steps in sequence of forming a copper interconnect structure.

Figure 1A:
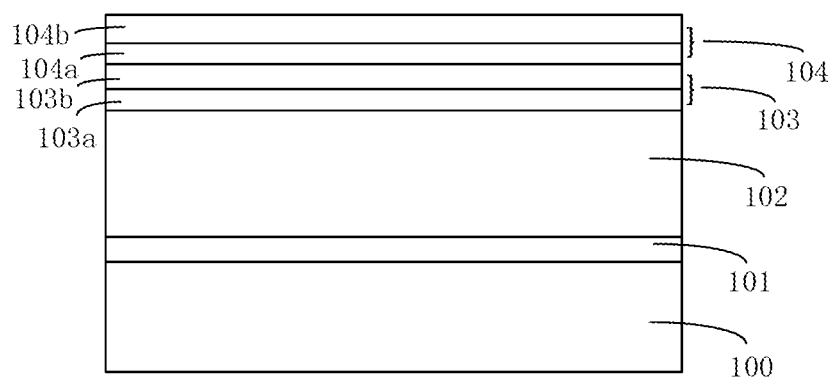
FIGS. 1A to 1E are simplified cross-sectional view illustrating sequential process steps of manufacturing a copper interconnect structure in prior art.

As shown in FIG. 1A, a semiconductor substrate 100 is provided. Using a chemical vapor deposition process, an etch stop layer 101, an interlayer dielectric layer 102, a buffer layer 103, and the hard mask layer 104 are sequentially formed on semiconductor substrate 100.

For reasons of clarity the front-end of line processing is not shown in the Figures. The front-end of line is processed to form a semiconductor device before the back-end of line (BEOL) process is further processed to the semiconductor device. The present invention is not limited to any of the front-end of line processes. The front-end of line device may include a gate structure, as an example, the gate structure may include a gate dielectric layer and a gate electrode sequentially formed on a semiconductor substrate. Sidewall structures may be formed on opposite sides of the gate structure and source/drain regions may be formed in the semiconductor substrate on both sides of the sidewall structures, a channel region formed between the source/drain regions, and a self-aligned suicide formed on the top of the gate structure and on the source/drain regions.

Etch stop layer 101 can comprise SiCN, SiC, or SiN and serve as the etch stop layer for a subsequent interlayer dielectric layer 102 to form a copper interconnect structure, to prevent the diffusion of copper interconnect lines into the upper interlayer dielectric layer.

The material of interlayer dielectric layer 102 may be selected from those various low dielectric constant (k constant) materials, including, but not limited to, the silicate compound (Hydrogen Silsesquioxane, referred to as HSQ) with a k constant in the range of 2.5 to 2.9, the methyl silicate compound (Methyl Silsesquioxane, referred to as MSQ) with a k constant of 2.2, the HOSP™ (manufactured by Honeywell based on the mixture of low dielectric constant organic material and silicon oxide) with a k constant of 2.8, and the SiLK™ (manufactured by Dow Chemical) with a k value of 2.65, etc. In general, materials for forming interlayer dielectric layer 102 have ultra-low-k constant, and the ultra-low-k material refers to as a material having a k constant of less than 2.

Buffer layer 103 comprises from bottom to top a transition layer 103$a$ and a TEOS (tetraethylorthosilicate) layer 103$b$ sequentially formed on the interlayer dielectric layer 102. The transition layer 103$a$ serves to increase the adhesion between an ultra-low k material and the TEOS layer. The function of TEOS layer 103$b$ is to avoid damage caused by mechanical stress during the subsequent polishing of a copper interconnect structure filled with a metal layer and the porous ultra-low-k material. Transition material layer 103$a$ includes a material of SiN, SiC or SiOC.

The hard mask layer 104 includes from bottom to top a metal hard mask layer 104$a$ and an oxide hard mask layer 104$b$ that are sequentially formed on buffer layer 103. The double-layer structure of the hard mask layer is to ensure double or multiple precision patterning process and to ensure that the trench depth and sidewall profiles are formed consistently in the hard mask layer 104, i.e., the first trench patterns having different feature sizes are formed in the oxide hard mask pattern layer 104$b$, and then metal hard mask layer 104$a$ is etched using the oxide hard mask pattern layer 104$b$ as a mask pattern to generate the desired trench patterns. Metal hard mask layer 104$a$ may include TiN, RN, or a combination thereof, preferably TiN. Oxide hard mask layer 104$b$ comprises SiO2, SiON, etc. The material of hard mask layer 104$a$ is required to have good etch selectivity.

Figure 1B:
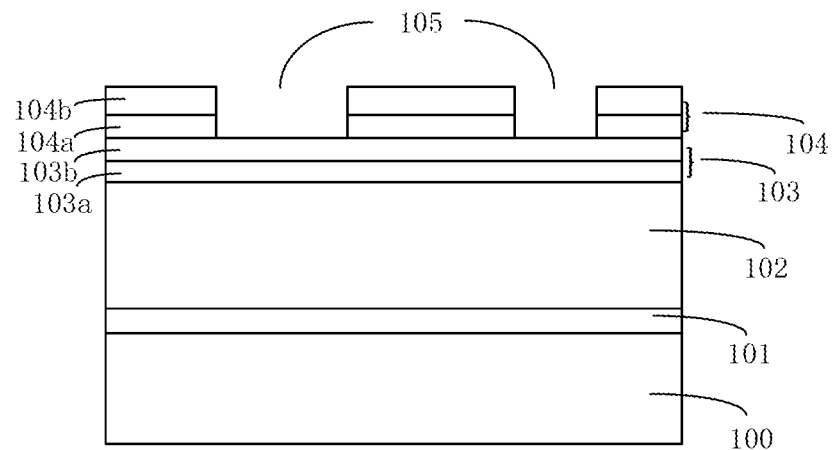

Thereafter, as shown in FIG. 1B, a first opening 105 is formed in the hard mask layer 104 to expose a surface of the buffer layer 103. The first opening 105 is used as the patterned trench of the copper interconnect structure, which may include a pattern having a multitude of different feature sizes.

According to applications, there may be a need to submit the patterned trench to two or more patterning processes, each patterning process includes the following steps: sequentially forming an ODL layer (organic dielectric layer), a BARC layer (bottom antireflective coating), and a PR layer (photoresist layer) on oxide hard mask layer 104$b$; performing a lithography process and a developing process on the PR layer to form a patterned trench in the PR layer; sequentially etching the BARC layer, the ODL hard mask layer and the oxide layer 104$b$ using the patterned PR layer as a mask to form a patterned trench in the oxide hard mask layer 104$b$. The patterning process also includes removing the patterned PR layer, the BARC layer and the ODL layer using an ashing process. Finally, using the patterned oxide hard mask layer 104b as a mask, etching the metal hard mask layer 104a to form first opening 105.

Figure 1C:
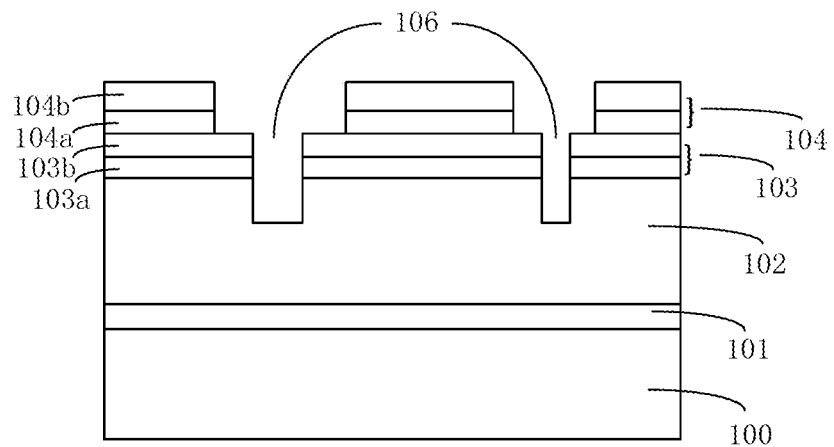

Thereafter, as shown in FIG. 1C, the process further includes forming a second opening 106 in the buffer layer 103 and in the interlayer dielectric layer 102, second opening 106 is used as a via of the copper interconnect structure, which may also include pattern having different feature sizes.

According to applications, there may be a requirement to submit the via to two or more patterning processes. Each via patterning process may include the following steps: sequential sequentially forming an ODL layer, a BARC and a PR layer 105 on semiconductor substrate layer 100 to cover first opening 105; performing a lithography process and a developing process on the PR layer to form a via in the PR layer; etching the BARC layer, the ODL layer, buffer layer 103 and inter-layer dielectric layer portion 102 using the patterned PR layer as a mask; forming a via in buffer layer pattern 103 and interlayer dielectric layer 102; removing the patterned PR layer, BARC layer and ODL layer using an ashing and other processes.

Figure 1D:
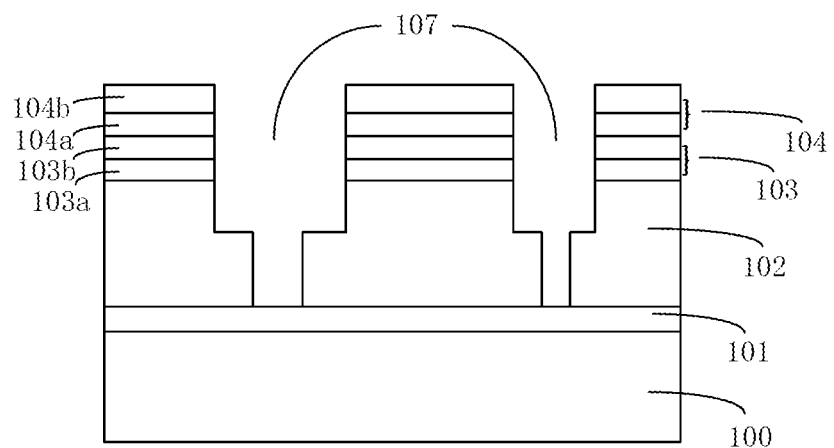

Next, as shown in FIG. 1D, using hard mask layer 104 as a mask, the via forming process may further include concurrently etching buffer layer 103 and interlayer dielectric layer 102 using an integrated etch (all-in-one etch) process to form a copper interconnect structure 107 in the low-k dielectric layer 102. In other words, the copper interconnection structure is formed by concurrently forming the trench and the via. The integrated etch process stops when the etch stop layer 101 is exposed.

Figure 1E:
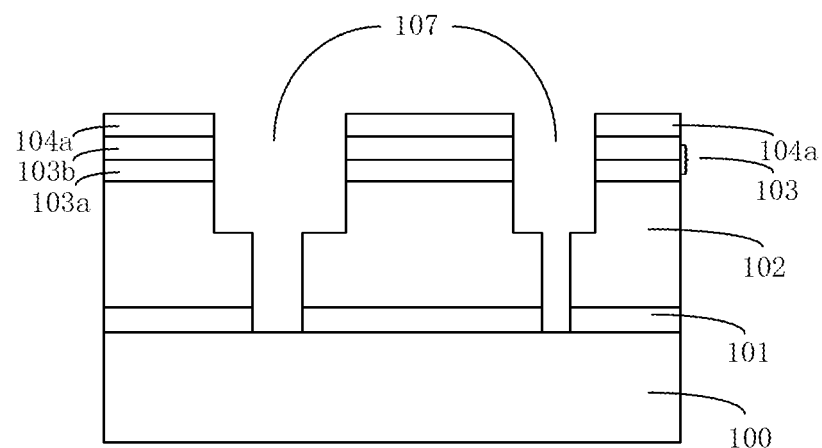

Next, as shown in FIG. 1E, the exposed portion of etch stop layer 107 is removed by etching so that the copper metal interconnect structure 107 is in communication with the front-end of line portion on semiconductor device substrate 100. In an embodiment of the present invention, a dry etching process is used for removing etch stop layer 101. Then, before the copper interconnect structure 107 is filled with copper, after the etching process has been performed, etch residue and impurities are removed to ensure the deposition quality of subsequent depositions of copper diffusion barrier layer and copper seed layer. A conventional wet cleaning process may be used to remove the etch residue and other impurities. In an embodiment, the etching process may also remove oxide hard mask layer 104b to lower the copper the aspect ratio for a subsequent copper filling.

The above described process of forming copper metal interconnect structure 107 is one possible damascene process. Those skilled in the art would know that other damascene processes of forming copper interconnect structure 107 may also be used, for example, forming the via hole first and then forming a trench for copper metal interconnect structure 107, the damascene process will not be described in detail herein.

Next, referring to FIGS. 1F through 1J, which show simplified cross-sectional views of sequential steps of a method according to an exemplary embodiment of the present invention.

Figure 1F:
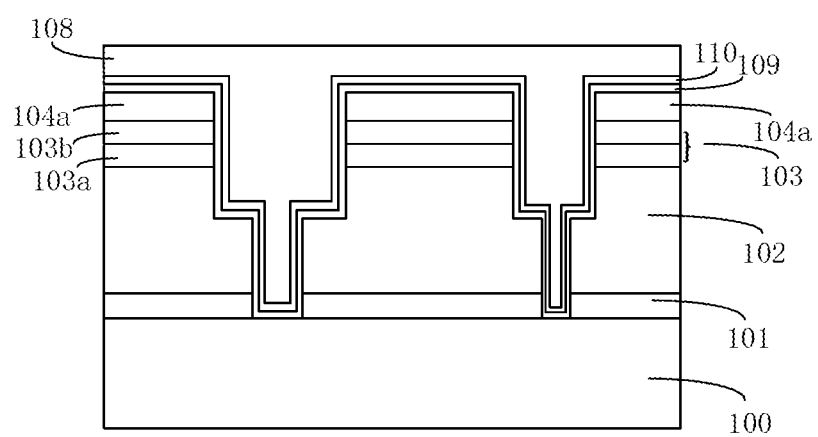
FIGS. 1F to 1J are simplified cross-sectional view illustrating sequential process steps of manufacturing a semiconductor device having a copper interconnect structure according to an example embodiment of the present invention.

Referring to FIG. 1F, a copper layer 108 is formed in the copper interconnect structure 107. Layer 108 may be formed of copper using a variety of well-known and suitable processes, such as physical vapor deposition process or a plating process.

Before forming copper layer 108, a copper diffusion barrier layer 109 and a copper metal seed layer 110 are sequentially formed at the bottom and sidewalls of copper interconnect structure 107, copper diffusion barrier layer 109 may prevent copper layer 108 from defusing into interlayer dielectric layer 102, copper metal seed layer 110 may enhance the adhesion between the copper layer 108 and copper diffusion barrier layer 109. Forming copper diffusion barrier metal layer 109 and copper seed layer 110 may employ a variety of suitable processes known to those skilled in the art, for example, a physical vapor deposition process may be used for forming a copper diffusion barrier layer 109, a sputtering process or a chemical vapor deposition process may be used for forming copper metal seed layer 110. In an embodiment, copper diffusion barrier layer 109 can be a metal, a metal nitride or combinations thereof, preferably a combination of Ta and TaN, or a combination of Ti and TiN.

Figure 1G:
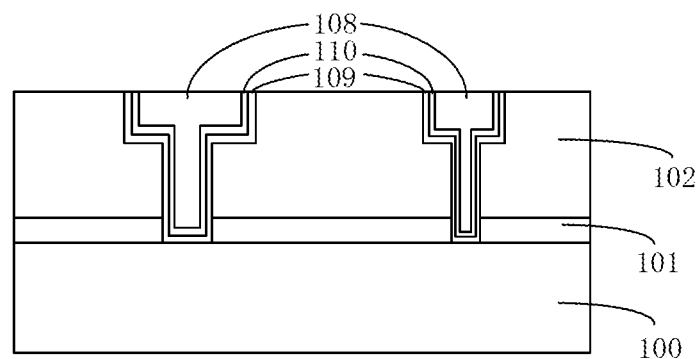

Subsequently, as shown in FIG. 1G, a chemical mechanical polishing (CMP) process may be used to expose the interlayer dielectric layer 102. In the CMP process, the metal hard mask layer 104a and the buffer layer 103 are removed.

Figure 1H:
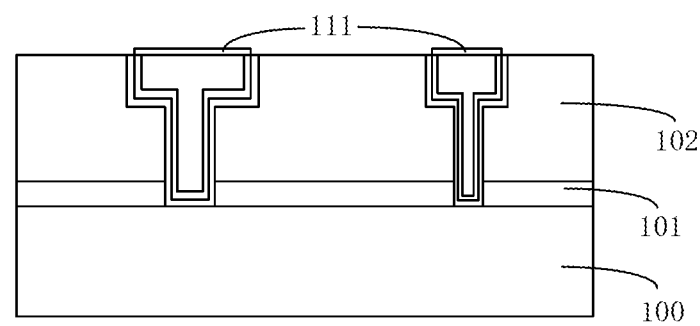

Subsequently, as shown in FIG. 1H, a cobalt metal layer 111 is formed on top of copper layer 108. Cobalt metal layer 111 may have a thickness in the range between 1 Å and 20 Å. In an embodiment of the present embodiment, a selective chemical vapor deposition process may be used for forming cobalt metal layer 111. In an embodiment, the process is performed under the following conditions: at a temperature below 400° C., at a pressure in the range between 0.01 Torr to 20 Torr (mmHg), and a carrier gas containing helium (He) or argon (Ar), and a precursor being an organic cobalt compound that can be selectively deposited on any metal surface. In a preferred embodiment, the organic cobalt compound is cyclopentadienyl dicarbonyl cobalt (formula $C_7H_5CoO_2$). The selective deposition process is referred to a precursor that can only form a deposit on a metal surface and not on anon-metal surface. Therefore, a cobalt layer 111 is formed on the top surface of the copper metal seed layer 110. Due to the presence of cobalt layer 111, electromigration caused by the copper diffusion will significantly be reduced.

Figure 1I:
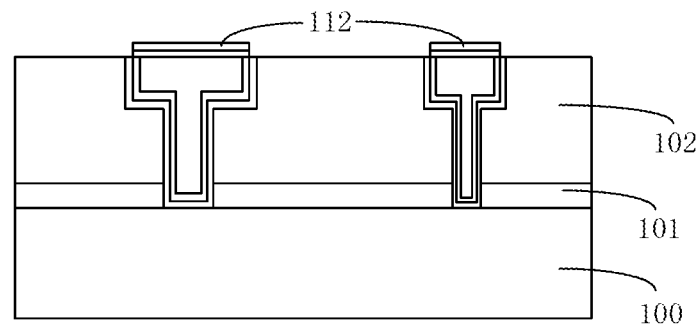

Subsequently, as shown in FIG. 1I, an aluminum layer 112 is formed on cobalt metal layer 111. Aluminum layer 112 has a thickness in the range between 1 Å and 20 Å. In an embodiment of the present embodiment, a selective chemical vapor deposition process may be used to form aluminum metal layer 112. The process may be carried out under the conditions: at a temperature below 400° C., at a pressure in the range of 0.01-20 Torr, a carrier gas is helium (He) or argon gas (Ar), with a precursor that can be any precursor that can selectively form a deposit on a metal surface. In a preferred embodiment, the organic aluminum compound may be dimethyl ethyl amine alane (formula $AlH_3$: $(N(CH_3)_2\ C_2H_5)$). The selective deposition process is referred to a precursor that can only form a deposit on a metal surface and not on a non-metal surface. Compared to the adhesion between copper layer 108 and etch stop layer 101 subsequently formed thereon, the adhesion between aluminum layer 112 and copper layer 108 copper is significantly improved.

Figure 1J:
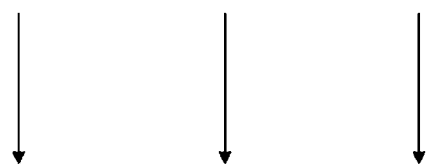
Figure 1J:
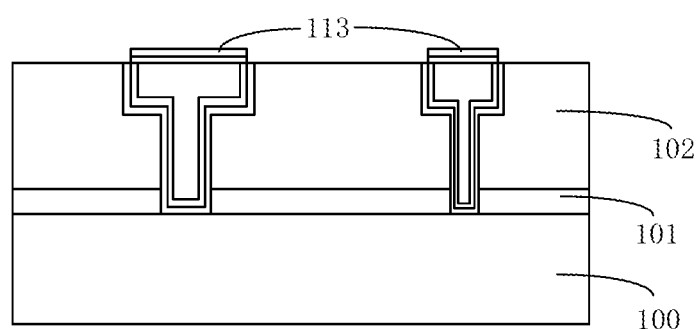

Subsequently, as shown in FIG. 1J, aluminum layer 112 is treated in a nitrogen-containing plasma gas to convert it to an AlN layer 113. The plasma treatment is carried out at a temperature in the range of 10-400° C., under a pressure of 0.001-7.0 Torr, with a power in the range of 100-2000 W, and a flow of nitrogen-containing gas in the range of 100-2000 sccm (cc/minute). The nitrogen-containing gas may be nitrogen ($N_2$) or ammonia ($NH_3$) in a specific embodiment. AlN layer 113 and a subsequent etch layer formed thereron will have a good adhesion.

After the completion of the described process steps of a method according to an exemplary embodiment of the present invention, the semiconductor device can be further processed by subsequent production processes including a process of forming an upper etch stop layer on interlayer dielectric layer 102 and on the stack of cobalt layer 111 and AlN layer 113, and a process of forming an upper interlayer dielectric layer on copper interconnect structure 107 on the upper etch stop layer, a process of forming copper interconnect structure 107, and a process of forming copper layer 108, and other processes.

Figure 2:
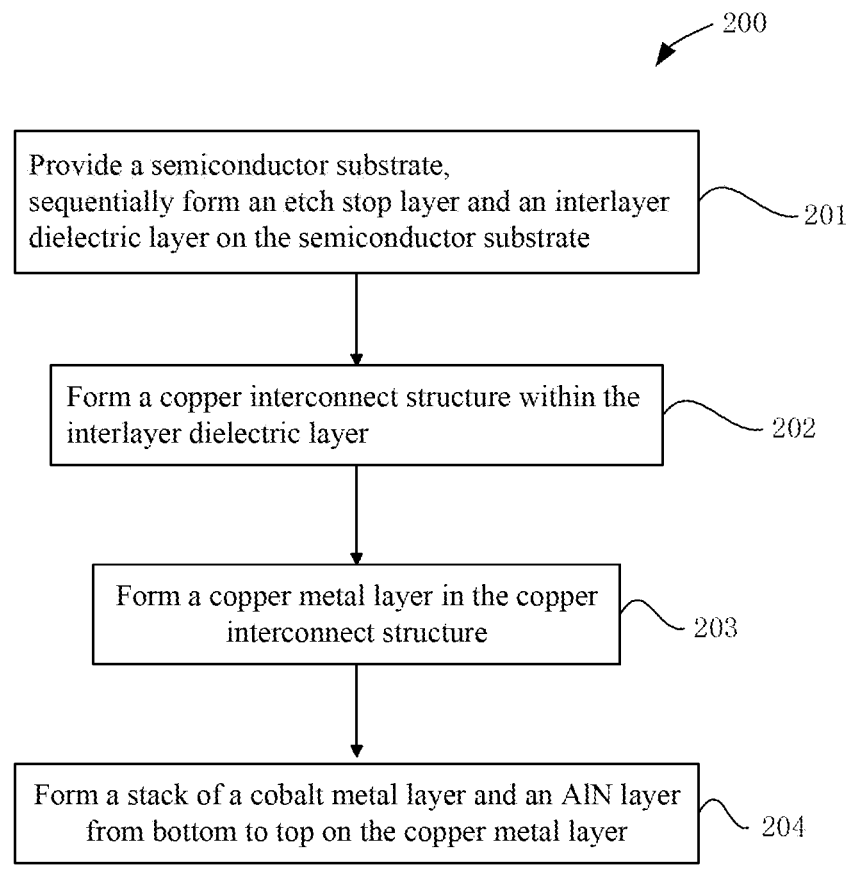
FIG. 2 is a flowchart diagram of a method for making a semiconductor device having improved electrical characteristics according to an example embodiment of the present invention.

FIG. 2 shows a flowchart of an exemplary method 200 for forming a semiconductor having improved electrical characteristics according to an embodiment of the present invention. As shown in FIG. 2, method 200 for forming a semiconductor having improved electrical characteristics comprises the following steps:

Step 201: a semiconductor substrate is provided, with an etch stop layer and an interlayer dielectric layer sequentially formed on the semiconductor;

Step 202: a copper interconnect structure is formed in the interlayer dielectric layer;

Step 203: a copper layer is formed in the copper interconnect structure; and

Step 204: a cobalt layer and an AlN layer are sequentially formed from bottom to top in the copper interconnect structure.

According to embodiments of the present invention, forming a copper layer 108 and an AlN layer from bottom to top of copper interconnect structure 107 effectively reduce electromigration caused by copper diffusion, at the same time the method also improves the adhesion between copper layer 108 and an upper etch stop layer firmed thereon and prevents delamination.

Embodiments of the present invention have been described above for illustrative purposes. However, the scope of the present invention is not limited to the detailed description of the embodiments. Modifications may be made to the embodiments of the present inventions by those skilled in the art without departing from the scope of the present invention.

What is claimed is:

1. A method of manufacturing a semiconductor device, comprising:
   providing a semiconductor substrate;
   sequentially forming an etch stop layer and an interlayer dielectric layer on the semiconductor substrate;
   forming a copper interconnect structure in the interlayer dielectric layer;
   forming a copper layer in the copper interconnect structure;
   forming a cobalt layer on the copper layer; and
   forming an aluminum nitride (AlN) layer on the cobalt layer.

2. The method of claim 1, wherein forming the cobalt layer comprises a selective chemical vapor deposition process.

3. The method of claim 2, wherein the cobalt layer has a thickness in a range between 1 to 20 angstroms.

4. The method of claim 2, wherein the chemical vapor deposition process is performed at a temperature below 400 degrees C., a pressure in a range between 0.01 and 20 Torr, and with a carrier gas of helium or argon.

5. The method of claim 4, wherein the chemical vapor deposition process comprises a cobalt precursor including an organic cobalt compound that is selectively deposited only on a metal surface.

6. The method of claim 1, wherein forming the AlN layer comprises:
   forming an aluminum layer on the cobalt layer; and
   submitting the aluminum layer to a nitrogen-containing plasma gas treatment.

7. The method of claim 6, wherein forming the aluminum layer comprises a selective chemical vapor deposition process.

8. The method of claim 7, wherein the aluminum layer has a thickness in a range between 1 and 20 angstroms.

9. The method of claim 7, wherein the aluminum layer is deposited at a temperature of below 400 degrees C., a pressure in a range between 0.01 and 20 Torr, and with a carrier gas of helium or argon.

10. The method of claim 9, wherein the selective chemical vapor deposition process comprises an aluminum precursor including an organic aluminum compound that is selectively deposited only on a metal surface.

11. The method of claim 10, wherein the organic aluminum compound is dimethyl ethyl amine alane.

12. The method of claim 6, wherein the nitrogen-containing gas plasma treatment is performed at a temperature in a range between 10 and 400 degrees C., a pressure in a range between 0.001 and 7.0 Torr, a power in a range between 100 and 2000 W, and a flow rate of a nitrogen containing gas of 100 to 2000 sccm.

13. The method of claim 6, wherein the nitrogen-containing gas plasma treatment comprises a nitrogen gas or ammonia gas.

14. The method of claim 1, wherein, after forming the copper interconnect structure, further comprising:
   removing an etch residue in the copper metal interconnect structure after an exposed portion of the etch stop layer has been etched.

15. The method of claim 1, wherein, prior to forming the copper layer, further comprising:
   sequentially forming a copper diffusion barrier layer and a copper seed layer on the bottom and sidewalls of the copper interconnect structure.

16. The method of claim 15, wherein the copper diffusion barrier layer is a metal, a metal nitride, or combinations thereof.

17. The method of claim 1, wherein the etch stop layer is SiCN, SiC, or SiN.

18. The method of claim 1, wherein the interlayer dielectric layer is a material having a low dielectric constant.

19. A semiconductor device comprising:
   a semiconductor substrate;
   an etch stop layer on the semiconductor substrate;
   an interlayer dielectric layer on the etch stop layer;
   a copper interconnect structure formed in the interlayer dielectric layer;
   a copper layer formed in the copper interconnect structure;
   a cobalt layer on the copper layer; and
   an aluminum nitride (AlN) layer on the cobalt layer.

* * * * *